United States Patent [19]

Kalisher et al.

[11] Patent Number: 4,946,543

[45] Date of Patent: Aug. 7, 1990

[54] METHOD AND APPARATUS FOR GROWING FILMS ON A SUBSTRATE

[76] Inventors: Murray H. Kalisher, 555 S. San Marcos Rd., Santa Barbara, Calif. 93111; Paul E. Herning, 1410 N. Refugio Rd., Santa Ynez, Calif. 93460

[21] Appl. No.: 178,803

[22] Filed: Mar. 29, 1988

Related U.S. Application Data

[63] Continuation of Ser. No. 870,478, Jun. 2, 1986, abandoned.

[51] Int. Cl.$^5$ .............................................. C30B 23/06
[52] U.S. Cl. .................................. 156/612; 156/606; 156/610; 156/611; 156/DIG. 70; 156/DIG. 83
[58] Field of Search ............... 156/610, 611, 612, 606, 156/DIG. 70, DIG. 83; 437/237

[56] References Cited

U.S. PATENT DOCUMENTS

| | | | |
|---|---|---|---|
| 3,472,685 | 10/1969 | Marfaing et al. | 117/201 |
| 3,473,974 | 10/1969 | Faust et al. | 156/610 |
| 3,591,346 | 7/1971 | Kluckow et al. | 156/610 |
| 3,657,004 | 4/1972 | Merkel et al. | 156/610 |
| 4,179,326 | 12/1979 | Kudo et al. | 156/612 |
| 4,190,470 | 2/1980 | Walline | 156/606 |
| 4,250,205 | 2/1981 | Constant et al. | 156/DIG. 70 |
| 4,418,096 | 11/1983 | Gauthier et al. | 427/160 |
| 4,482,422 | 11/1984 | McGinn et al. | 156/612 |
| 4,487,640 | 12/1984 | Erstfeld | 156/610 |
| 4,556,436 | 12/1985 | Addaniane | 156/610 |
| 4,566,918 | 1/1986 | Irvine et al. | 156/613 |
| 4,612,072 | 9/1986 | Morrison et al. | 156/612 |
| 4,648,917 | 3/1987 | Kay et al. | 156/606 |
| 4,655,848 | 4/1987 | Kay et al. | 428/620 |
| 4,762,576 | 8/1988 | Wilson et al. | 156/611 |

FOREIGN PATENT DOCUMENTS

| | | | |
|---|---|---|---|
| 2454110 | 5/1976 | Fed. Rep. of Germany | 156/610 |
| 53-75862 | 7/1978 | Japan | 437/237 |
| 449590 | 4/1968 | Switzerland | 156/610 |

OTHER PUBLICATIONS

Pamplin, "CRYSTAL GROWTH", Pergamon Press, New York, Second Edition 1980 pp. 4 to 5.
Piotrowski, "ISOTHERMAL GROWTH HOMOGENEOUS" $Hg_{1-x-y}Cd_xMn_yTe$ CRYSTALS Journal of Crystal Growth, vol. 71 (1985) pp. 453-455.
Information Disclosed by Inventors at the Electronic Materials Conference held June 20, 22, 1984.
Abstract of Presentation Entitled "Elemental Multi-Source Vapor-Transport-Interdiffusion Epitaxy of $Hg_{1-x}Cd_xTe$."

*Primary Examiner*—Robert L. Stoll
*Assistant Examiner*—Robert M. Kunemund

[57] ABSTRACT

A method and apparatus for growing films on a plurality of substrates is disclosed. The apparatus includes a substrate rack for securing a plurality of substrates on a predetermined position. An ampoule is also provided which environmentally isolates the substrates. The ampoule includes first and second reservoirs for storing source material at opposite ends of ends of the ampoule.

13 Claims, 1 Drawing Sheet

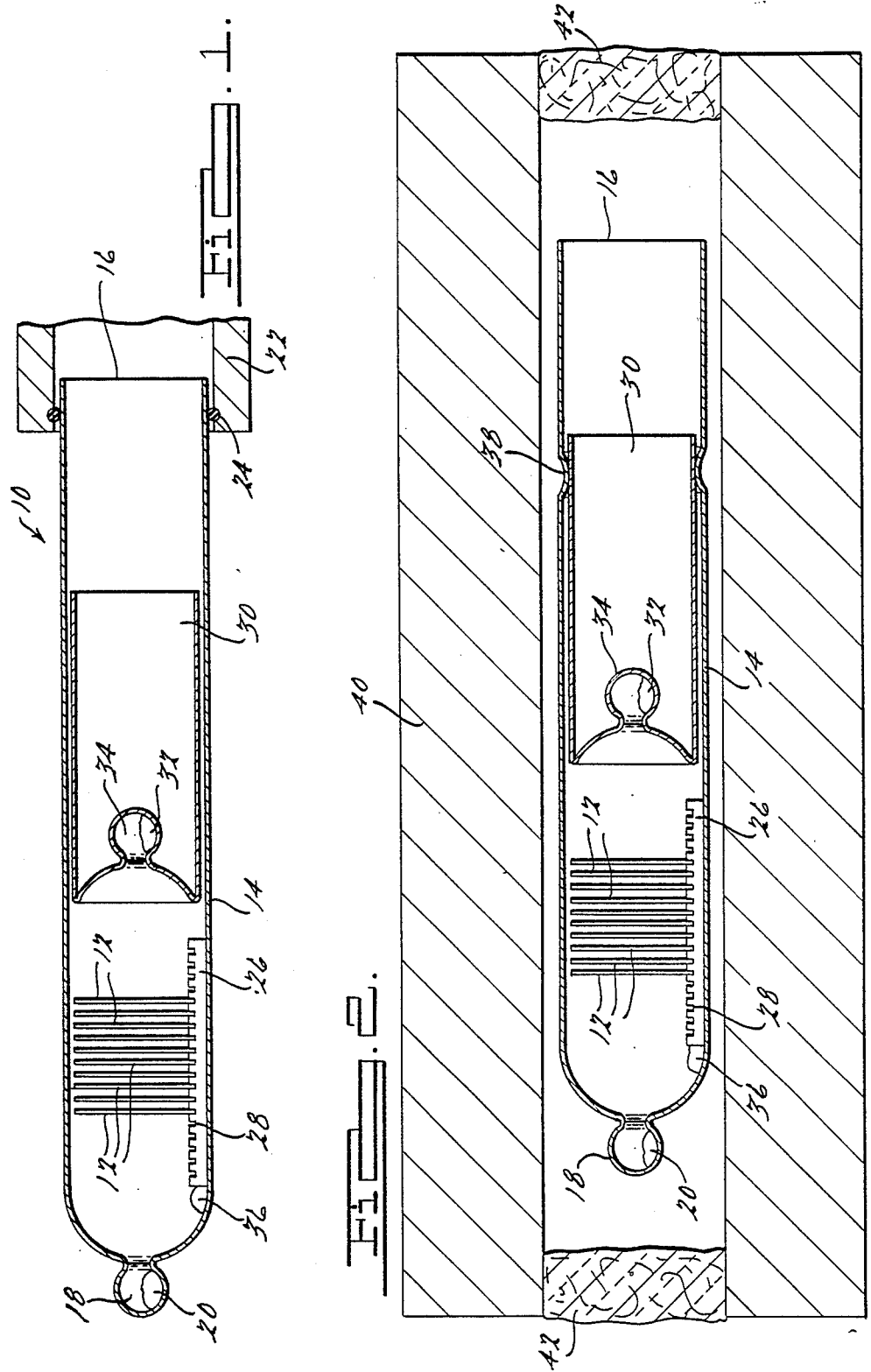

METHOD AND APPARATUS FOR GROWING FILMS ON A SUBSTRATE

This application is a continuation of application Ser. No. 870,478, filed Jun. 2, 1986, now abandoned

BACKGROUND OF THE INVENTION

1. Field of the Invention

This invention relates to growing crystalline films on substrate materials, and more particularly concerns a method and apparatus for forming epitaxial films.

2. Description of Related Art

Infrared detectors are often used in conjunction with missiles and night vision systems to sense the presence of electromagnetic radiation having wavelengths between 1–15 $\mu$m. These detectors often operate on the principle of photoconductivity, in which infrared radiation changes the electrical conductivity of the material upon which the radiation is incident. Elemental detectors may also rely on photovoltaic or photoemission properties of certain materials to detect infrared radiation.

To fabricate such detectors, crystalline films of materials such as $Hg_{1-x}Cd_xTe$ are often grown on substrate materials which may have an initial layer of CdTe. Techniques for growing such films include liquid-phase epitaxy ("LPE"). In LPE technology, a crystalline film is formed by using a "bottomless bin" filled with a melt which is either at solid-liquid equilibrium or slightly undersaturated. The melt is then cooled while a substrate material is exposed to the bottom of the bin causing the film to grow on the substrate. The desired thickness of the film is obtained by controlling the temperature of the melt or the duration of the exposure of the substrate to the melt. Other techniques for forming epitaxial films include chemical vapor deposition and molecular beam epitaxy.

While such methods for epitaxially growing films on substrate materials are generally effective, they often have several disadvantages. The films could generally be grown on a relatively small number of substrates simultaneously and often did not produce films of relatively uniform thickness on each substrate. Annealing was also required to fill vacancies remaining in the grown film after growth had occurred to insure the desired electrical characteristics. Further, the films produced by these technologies tended to have relatively high interface state densities which would generally reduce charge transfer efficiency. Impurities were also introduced into the films when certain growth techniques were used as the melt, which often contained impurities, was often required to be placed in direct contact with the substrate. These impurities would often trap charge carriers which also tended to reduce charge transfer efficiency. In addition, since these methods often required the use of compounded sources such as HgTe or $Hg_xTe_{1-x}$, impurities introduced into the sources during the compounding process would also be present in the resulting films. Finally, these processes were not generally used to dope the films during the growth, nor were they generally used in conjunction with masks to grow films on selected regions of the substrate.

SUMMARY OF THE INVENTION

According to the preferred embodiment of the present invention, a method and apparatus for growing films on a plurality of substrates is disclosed. The apparatus includes a substrate rack for securing a plurality of substrates in a predetermined position. An ampoule also provided which environmentally isolates the substrates. The ampoule includes first and second reservoirs for storing source material at opposite ends of the ampoule.

BRIEF DESCRIPTION OF THE DRAWINGS

Various advantages of the present invention will become apparent to one skilled in the art upon reading the following specification and references to the following drawings in which:

FIG. 1 is a cross-sectional view of the ampoule according to the present invention; and FIG. 2 is a cross-sectional view of the ampoule shown in FIG. 1 positioned in a growth furnace.

DESCRIPTION OF THE PREFERRED EMBODIMENT

Referring to FIG. 1, an ampoule 10 is provided for growing epitaxial films on a plurality of substrates 12. The ampoule 10 comprises a capsule 14 having an open end 16. The capsule 14 includes a first reservoir 18 which is used to contain source material 20 for use in the formation of the epitaxial films discussed below. It is to be understood, however, that other means for environmentally isolating the substrates 12 may be used. While the capsule 14 may be fabricated from quartz, other suitable materials may be used.

The source material 20 from which the film is formed may generally be characterized as having a higher vapor pressure than material on the surface of the substrates 12. In addition, the source material 20 should be able to interdiffuse relatively easily into the surface layer of the substrates 12. Suitable source-substrate combinations include zinc-telluride and cadmium-telluride, mercury-telluride and cadmium-telluride, mercury-telluride and zinc-telluride, mercury-telluride and lead-telluride, cadmium-telluride and germanium-telluride, indium-arsenide and gallium-antimonide. The source material 20 may be in elemental form such as Hg and Te, or may be in compounded form such as HgTe.

To evacuate gases from the ampoule 10, an oil-less vacuum pumping system 22 is provided. The vacuum pumping system 22 is used to withdraw environmental gases from the capsule 14 prior to formation of the film. Alternatively, the ampoule may be filled with a reducing type gas such as hydrogen or an inert gas such as argon. To form a seal between the capsule 14 and the vacuum pumping system 22, a compression seal 24 is provided. The compression seal 24 is disposed between the capsule 14 and the pumping system 22 to prevent leakage therebetween while the capsule 14 is being evacuated.

To secure a plurality of substrates 12 within the ampoule 10 during the growth process, a substrate rack 26 is provided. The substrate rack 26 includes a plurality of grooves 28 which are able to accommodate the substrates 12 in a substantially vertical position. It is to be understood, however, that the plane established by the surface of the substrates 12 need only be substantially perpendicular to a line between the first reservoir 18 and the second reservoir described below. While the substrate rack 26 may be fabricated from quartz, other suitable materials may be used.

To permit selective access to the inside of said ampoule 10, the ampoule 10 includes a plug 30. The plug 30 has an outer diameter which is sufficiently less than the inside diameter of the capsule 14 to allow environmental gases within the capsule 14 to be withdrawn during evacuation. To accommodate additional source material 32 during the growth process, the plug 30 includes a second reservoir 34. As discussed subsequently, the source material in the reservoirs 18 and 34 is vaporized and then deposited on the substrates 12 by vapor transport interdiffusion during the growth process. The size of the aperture of the reservoirs 18 and 34 may be used to control the growth rate of the films. By having two symetrically spaced reservoirs and orienting the substrates in a substantially vertical position, the uniformity of the film on the substrates is maintained. While the plug 30 may be made from quartz, other suitable materials may be used.

To prepare the ampoule 10 for growing epitaxial films, the capsule 14 and the plug 30 are etched using a suitable material such as an acid combination of 50:50 HF—HNO$_3$. After being rinsed with high-purity deionized water until the measured resistivity of the water reaches 18 meghoms, the capsule 14 and plug 30 are dried. The substrates 12 upon which films are grown are polished to an optical finish and then cleaned in boiling tricloroethylene to remove the residual paraffin used for mounting the substrates while the substrates are being polished. The substrates 12 are then etched in a ½% solution of bromine in methanol and are rinsed with high-purity deionized water until the measured resistivity of the water is 18 meghoms.

Once the capsule 14, the plug 30, and the substrates 12 are prepared as described above, source material is placed into the reservoirs 18 and 34 of the capsule 14 and the plug 30. Source material may also be placed in a pool 36 at the bottom of the ampoule 10 if desired. If dopant is to be used in forming the film, the dopant is placed in the ampoule 10. Environmental gases are then removed by placing in the plug 30 in the capsule 14 and connecting the open end 16 to the vacuum pumping system 22 and evacuating the ampoule until the pressure inside the ampoule 10 reaches approximately $2 \times 10^{-7}$ Torr. Alternatively, the ampoule may be filled with a reducing type gas such as hydrogen. To pneumatically seal the ampoule 10, a region 38 of the capsule 14 is heated causing the region 38 to soften. Because of the differential pressure across the walls of the capsule 14 created by the vacuum pumping system 22, the region 38 deforms against the plug 30 creating a seal therebetween. The seal created at the region 38 prevents environmental gases from entering the capsule 14 during the growth process described below.

To grow a film on the substrates 12, the ampoule 10 is placed in a growth furnace 40 as shown in FIG. 2. Both ends of the furnace 40 are sealed with a ceramic wool plug 42 after the ampoule 10 is inserted. The source materials 20 and 32 vaporize as the ampoule 10 is heated causing free molecules of the constituent elements to exist in the region around the substrates 12. Because the substrates 12 have a lower free energy than the source materials 20 and 32, the source materials 20 and 32 become bonded to the surface of the substrate 12 causing a growth layer to form. Because the constituents in the source materials 20 and 32 are able to interdiffuse with the constituents in the substrates 12, the constituents in the substrates 12 diffuse into the growth layer and the constituents of the growth layer are able to fill voids in the substrates 12 created by the diffusion. By the appropriate selection of the temperature and the duration of the growth process as well as the source-substrate distance, the composition of the growth layer may be controlled. Since the infrared sensitivity of the growth layer is related to the degree of interdiffusion between the growth layer and the substrates 12, appropriate selection of temperature at which the interdiffusion occurs as well as duration of interdiffusion can result in the production of substrates 12 having a given infrared sensitivity.

After the growth has occurred, the ampoule 10 is then removed from the furnace 40 and allowed to cool to ambient temperature. The ampoule 10 may be opened and the substrates 12 are removed. The capsule 14 and the plug 30 are then cleaned and a new section of quartz is fused onto the capsule 14 to allow reuse.

It will therefore be seen that the method and apparatus described above allows films to be formed on multiple substrates simultaneously. By using two sources symetrically arranged at each end of the ampoule 10 and orienting the substrates 12 vertically, substantially uniform films may be grown. Because elemental sources may be used, the need for compounded sources is eliminated thereby reducing the impurities introduced during formation of the compounded source. Annealing may be accomplished by reducing the temperature of the furnace 40 without requiring the removal of the substrates 12. Doping may be accomplished by adding high vapor pressure dopants as one of the components in the ampoule. Alternatively, dopants may be implanted into the substrates which then diffuse into the growth layer. Further, the growth layer may also be doped by initially forming the substrates with dopants such that the dopants will diffuse into the growth layer when heated. In addition, the source material may be formulated with dopant so that it may controllably released during the growth process. Finally, it will be seen that masks may be used to selectively grow films on regions on the substrates.

The following nonlimiting examples illustrate the practice of the invention:

EXAMPLE I

After the capsule and plug are prepared in the manner described above, ten substrates (hereinafter substrates A–J) were loaded into the capsule. The space between the substrates and the reservoir in the capsule is given in the table below:

| Substrate | Source/Substrate Distance (mm) | Peak Transmission Wavelength ($\mu$m) |
| --- | --- | --- |
| A | 36 | 4.2 |
| B | 46 | 3.6 |
| C | 58 | 3.5 |
| D | 66 | 3.3 |
| E | 76 | 3.25 |
| F | 83 | 3.25 |
| G | 86 | 3.2 |
| H | 96 | 3.25 |
| I | 106 | 3.35 |
| J | 115 | 3.8 |

All the substrates above were cadmium-telluride with the exception of substrate F which was $Cd_{0.96}Zn_{0.04}Te$. The source material was 3.4 grams of mercury-telluride roughly divided in two equal portions and placed in each reservoir. Substrate J was located 36 mm from the reservoir in the plug. The total exposed substrate area was 68 cm$^2$ and the total volume of the ampoule was 144 cm$^3$. The substrates were grown for 49 hours at a temperature of 511° C. The resulting substrates had the peak transmission wavelengths indicated above. Representative thicknesses of the films were 17 microns for substrate B, 14.2 microns for substrate E, 14.9 microns for substrate D, and 15.9 microns for substrate I.

EXAMPLE II

After the capsule and plug are prepared in the manner described above, twelve substrates (hereinafter substrates A–L) were loaded into the capsule. The space between the reservoir in the capsule is given in the table below:

| Substrate | Source/Substrate Distance (mm) | Peak Transmission Wavelength (μm) |
|---|---|---|
| A | 50 | 4.7 |
| B | 55 | 3.7 |
| C | 61 | 3.6 |
| D | 66 | 3.55 |
| E | 72 | 3.55 |
| F | 77 | 3.45 |
| G | 81 | 3.63 |
| H | 87 | 3.5 |
| I | 93 | 3.53 |
| J | 98 | 3.6 |
| K | 103 | 3.8 |
| L | 108 | 4.7 |

Substrates A, D, E, G, H and L were cadmium-telluride. Substrates B, C, F, I, J, K were $Cd_{0.96}Zn_{0.04}Te$. The reservoir in the plug was located at a distance of 158 mm from the reservoir in the capsule. The substrates were going for 48 hours at temperature of 513° C. The resulting substrates had peak transmission wavelenghts indicated above, and had thicknesses between 15–18 microns.

It should be understood that the invention was described in connection with a particular example thereof. The method and apparatus may be used in conjunction with other growth process such as LPE to form films using multiple processes. Steps in addition to those described above may be used which would otherwise not influence the basic method as claimed below. Other modifications will become apparent to those skilled in the art after a study of the specification, drawings and following claims.

What is claimed is:

1. A method for forming films on a plurality of substrates comprising the steps of:
   loading source material into a first reservoir portion of an annular capsule, said annular capsule having an interior region operable to accommodate said plurality of substrates, said annular capsule having an open ended portion axially extended from said first reservoir portion, said first reservoir portion having an aperture connecting said first reservoir portion to said interior region of said annular capsule;
   loading source material into a second reservoir portion of a removable annular plug, said second reservoir portion having an aperture connecting said second reservoir portion to said interior region of said annular capsule when said removable annular plug is inserted into said annular capsule;
   positioning a plurality of substrates in said annular capsule between said first reservoir portion and said open ended portion such that said plurality of substrates are substantially perpendicular to the axial center line of said annular capsule;
   inserting said removable annular plug into said open ended portion of said annular capsule until said first and second reservoir portions lie substantially equidistant from the center of said plurality of said substrates; and
   growing said films on said substrates by vaporizing said source material and allowing the constituents of said source material to interdiffuse with the constituents of said substrates, said films comprising the constituents of said source material and the constituents of said substrate;
   whereby the growth of said films may be controlled by the size of said aperture connecting said first reservoir portion to said interior region of said annular capsule and the size of said aperture connecting said second reservoir portion to said interior region of said annular capsule.

2. The method of claim 1, wherein said ampoule includes a capsule and a plug, said method includes the additional step of creating a seal between said capsule and said plug.

3. The method of claim 2, wherein said capsule and said plug each include a reservoir for receiving source material.

4. The method of claim 1, further including the additional step of loading dopant into the ampoule to allow doping of said films when said films are grown.

5. The method of claim 1, further including the additional step of locating a mask adjacent to the surface of at least one of said substrates to allow said film to be grown on a selective region of said substrate.

6. The method of claim 1, wherein said source material is in elemental form.

7. The method of claim 1, wherein said method includes the additional step of annealling said substrates after said films are grown while said substrates are in said ampoule.

8. A method for forming films on a plurality of substrates comprising the steps of:
   loading source material into a first reservoir portion of an annular capsule, said annular capsule having an interior region operable to accommodate said plurality of substrates, said annular capsule having an open ended portion axially extended from said first reservoir portion, said first reservoir portion having an aperture connecting said first reservoir portion to said interior region of said annular capsule;
   loading source material into a second reservoir portion of a removable annular plug, said second reservoir portion having an aperture connecting said second reservoir portion with said interior region of said annular capsule when said removable annular plug is inserted into said annular capsule;
   positioning a plurality of substrates in said annular capsule between said first reservoir portion and said open ended portion such that said plurality of substrates are substantially perpendicular to said axial center line of said annular capsule;
   inserting said removable annular plug into said open ended portion of said annular capsule until said first and second reservoir portions lie substantially equidistant from the center of said plurality of said substrates;
   evacuating said annular capsule by withdrawing environmental gases in said annular capsule through the space between the inner diameter of said annular capsule and the outer diameter of said plug;

deforming said annular capsule in a region proximate to said removable annular plug so that the inside diameter of said annular capsule substantially equals the outside diameter of said removable annular plug so as to create a seal therebetween; and growing said films on said substrates by vaporizing said source material and allowing the constituents of said source materials to interdiffuse with the constituents of said substrates, said films comprising the constituents of said source material and the constituents of said substrate;

whereby the growth of said films may be controlled by the size of said aperture connecting said first reservoir portion to said interior region of said annular capsule and the size of said aperture connecting said second reservoir portion to said interior region of said annular capsule.

9. The method of claim 8, wherein said source material is in elemental form.

10. The method of claim 8, wherein the plane established by the surface of at least one of said substrates is perpendicular to a line connecting said first and second reservoirs.

11. The method of claim 8, wherein said ampoule is filed with a reducing type gas.

12. The method of claim 8, wherein said ampoule is filed with an inert gas.

13. The method of forming films on a plurality of substrates comprising the steps of:

loading source material into a first reservoir portion of an annular capsule, said annular capsule having an interior region operable to accommodate said plurality of substrates, said annular capsule having an open ended portion axially extended from said first reservoir portion, said first reservoir portion having an aperture connecting said first reservoir portion to said interior region of said annular capsule;

loading source material into a second reservoir portion of a removable annular plug, said second reservoir portion having an aperture connecting said second reservoir portion with said interior region of said annular capsule when said removable annular plug is inserted into said annular capsule;

positioning a plurality of substrates in said annular capsule between said first reservoir portion and said open ended portion such that said plurality of substrates are substantially perpendicular to the axial center line of said annular capsule;

inserting said removable annular plug into said open ended portion of said annular capsule until said first and second reservoir portions lie substantially equidistant from the center of said plurality of said substrates;

evacuating said annular capsule by withdrawing environmental gases in said capsule through the space between the inner diameter of said capsule and the outer diameter of said plug;

deforming said annular capsule in a region proximate to said removable annular plug so that the inside diameter of said annular capsule in said region substantially equals the outside diameter of said removable annular plug so as to create a seal therebetween;

placing said ampoule in a growth furnace;

permitting the constituents of said vaporized source material to interdiffuse with the constituents of said substrates so as to form said films; and removing said removable annular plug from said annular capsule so as to permit access to said substrates;

whereby the growth of said films may be controlled by the size of said aperture connecting said first reservoir portion to said interior region of said annular capsule and the size of said aperture connecting said second reservoir portion to said interior region of said annular capsule.

* * * * *